(12) United States Patent
Kutz et al.

(10) Patent No.: US 8,299,850 B1
(45) Date of Patent: Oct. 30, 2012

(54) DEVICE WITH RECONFIGURABLE CONTINUOUS AND DISCRETE TIME FUNCTIONALITY

(75) Inventors: Harold Kutz, Edmonds, WA (US); Warren Snyder, Snohomish, WA (US); Monte Mar, Issaquah, WA (US); Dennis Seguine, Monroe, WA (US); Gajender Rohilla, Bothell, WA (US); Eashwar Thiagarajan, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/367,690

(22) Filed: Feb. 7, 2012

Related U.S. Application Data

(63) Continuation of application No. 12/762,207, filed on Apr. 16, 2010, now Pat. No. 8,111,097.

(60) Provisional application No. 61/176,906, filed on May 10, 2009.

(51) Int. Cl.
*H03F 1/02* (2006.01)
(52) U.S. Cl. .............................. 330/9; 330/86; 330/260
(58) Field of Classification Search ................ 330/9, 86, 330/260
See application file for complete search history.

(56) References Cited

U.S. PATENT DOCUMENTS

| | | | | |
|---|---|---|---|---|
| 3,911,776 | A * | 10/1975 | Beigel | 84/700 |
| 3,988,689 | A * | 10/1976 | Ochi et al. | 330/9 |
| 4,297,642 | A * | 10/1981 | Baldwin et al. | 330/9 |
| 4,623,854 | A * | 11/1986 | Kuraishi | 333/173 |
| 4,733,205 | A * | 3/1988 | Hughes | 333/172 |
| 4,739,189 | A * | 4/1988 | Kellogg | 327/555 |
| 6,329,939 | B1 * | 12/2001 | Swaminathan et al. | 341/143 |
| 6,545,534 | B1 | 4/2003 | Mehr | |
| 6,693,572 | B1 * | 2/2004 | Oliaei et al. | 341/143 |
| 7,642,848 | B2 | 1/2010 | Nakatani et al. | |

OTHER PUBLICATIONS

USPTO Non-Final Rejection for U.S. Appl. No. 12/762,207 dated Aug. 18, 2011; 4 pages.
USPTO Notice of Allowance for U.S. Appl. No. 12/762,207 dated Dec. 20, 2011; 6 pages.

* cited by examiner

*Primary Examiner* — Patricia Nguyen

(57) ABSTRACT

A programmable device includes an operational amplifier and circuitry. The operational amplifier is configured to generate an output voltage based on input voltages at input terminals thereof. The circuitry is configured to provide the input voltages to the operational amplifier. The configuration of the circuitry allows the programmable device to implement discrete-time or continuous-time functions. The circuitry includes a resistor network and a capacitor network configured to be selectively coupled to the operational amplifier.

20 Claims, 8 Drawing Sheets

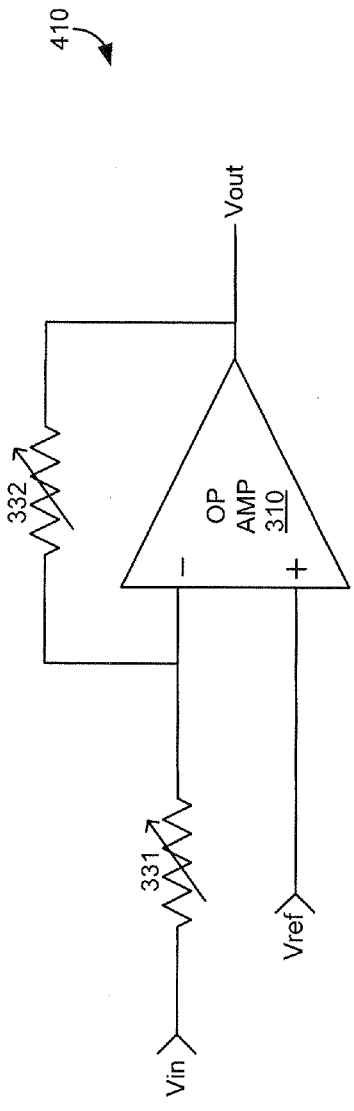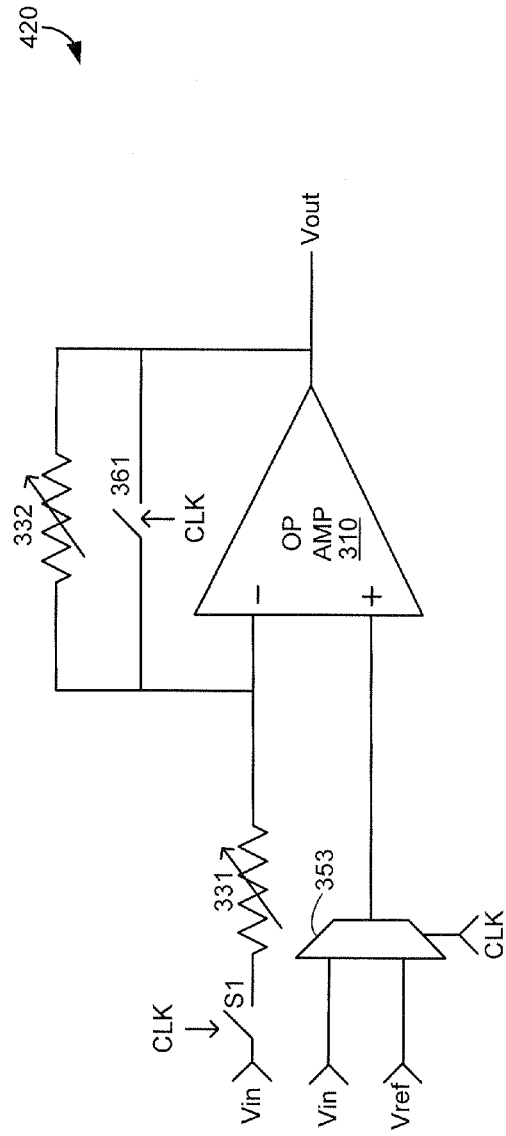
Figure 4A
Figure 4B

DEVICE WITH RECONFIGURABLE CONTINUOUS AND DISCRETE TIME FUNCTIONALITY

RELATED APPLICATION

This application is a continuation of U.S. application Ser. No. 12/762,207 filed Apr. 16, 2010, now U.S. Pat. No. 8,111,097, issued Feb. 7, 2012, which claims the benefit of and priority to the provisional patent application Ser. No. 61/176,906, with filing date May 10, 2009, both of which are hereby incorporated by reference in their entirety.

TECHNICAL FIELD

This disclosure relates generally to electronic circuits, and more particularly to an analog device with reconfigurable continuous and discrete time functionality.

BACKGROUND

Many electronic systems include circuits that provide fixed functionality. For instance, a signal processing device can include fixed function circuits, such as signal filters and analog-to-digital converters, to perform signal processing operations. By arranging these fixed-function circuits in particular configurations, electronic systems can be built to perform specific tasks.

Programmable electronic systems include more generalized circuits or blocks, such as digital and analog programmable blocks, that can be (re)programmed to implement a large number of peripherals. The digital blocks can include programmable circuitry configured to provide various digital functions. The analog blocks can be used for development of analog elements, such as analog filters, comparators, inverting amplifiers, as well as analog-to-digital and digital-to-analog converters. A programmable interconnect allows the analog and digital blocks to be combined to form a wide variety of functional modules.

The programmable analog blocks commonly implement one of continuous-time functions or discrete-time functions. Thus, system designers build programmable electronic systems to include programmable digital blocks, programmable analog continuous-time blocks, programmable discrete-time blocks, as well as various fixed function circuits.

SUMMARY

This patent application discloses a programmable system comprising a programmable analog device including an operational amplifier to generate an output voltage based on input voltages at terminals of the operational amplifier. The programmable system also includes a system controller to direct the programmable analog device to reconfigure analog circuitry providing the input voltages to the operational amplifier. The reconfiguration of the analog circuitry allows the programmable analog device to implement discrete-time or continuous-time functions.

In some embodiments, a programmable analog device includes an operational amplifier to generate an output voltage based on input voltages received at input terminals of the operational amplifier. The programmable analog device also includes analog circuitry including a resistor network and a capacitor network. The analog circuitry is reconfigurable to provide the input voltages to the input terminals of the operational amplifier through the resistor network. The analog circuitry is further reconfigurable to provide the input voltages to the input terminals of the operational amplifier through the capacitor network.

In some embodiments, a method includes receiving, with a programmable analog device, one or more first control signals from a system controller, and configuring the programmable analog device to perform one or more continuous-time functions responsive to the one or more first control signals. The method can further include receiving, with the programmable analog device, one or more second control signals from a system controller, and reconfiguring the programmable analog device to perform one or more discrete-time functions responsive to the one or more second control signals.

DESCRIPTION OF THE DRAWINGS

FIGS. 4A-4E are block diagram examples of various continuous-time and discrete-time configurations for the reconfigurable analog block shown in FIGS. 3A-3B.

DETAILED DESCRIPTION

A programmable system on a chip (PSOC) or other electronic system can include a core processing device and programmable analog and digital components that can work in conjunction to perform various data operations. The programmable analog components can incorporate analog circuitry, such as both a resistor network and a capacitor network, which allows the programmable analog components to be reconfigured by the core processing device to implement both continuous-time functions and discrete-time functions. Embodiments are shown and described below in greater detail.

Figure 1:
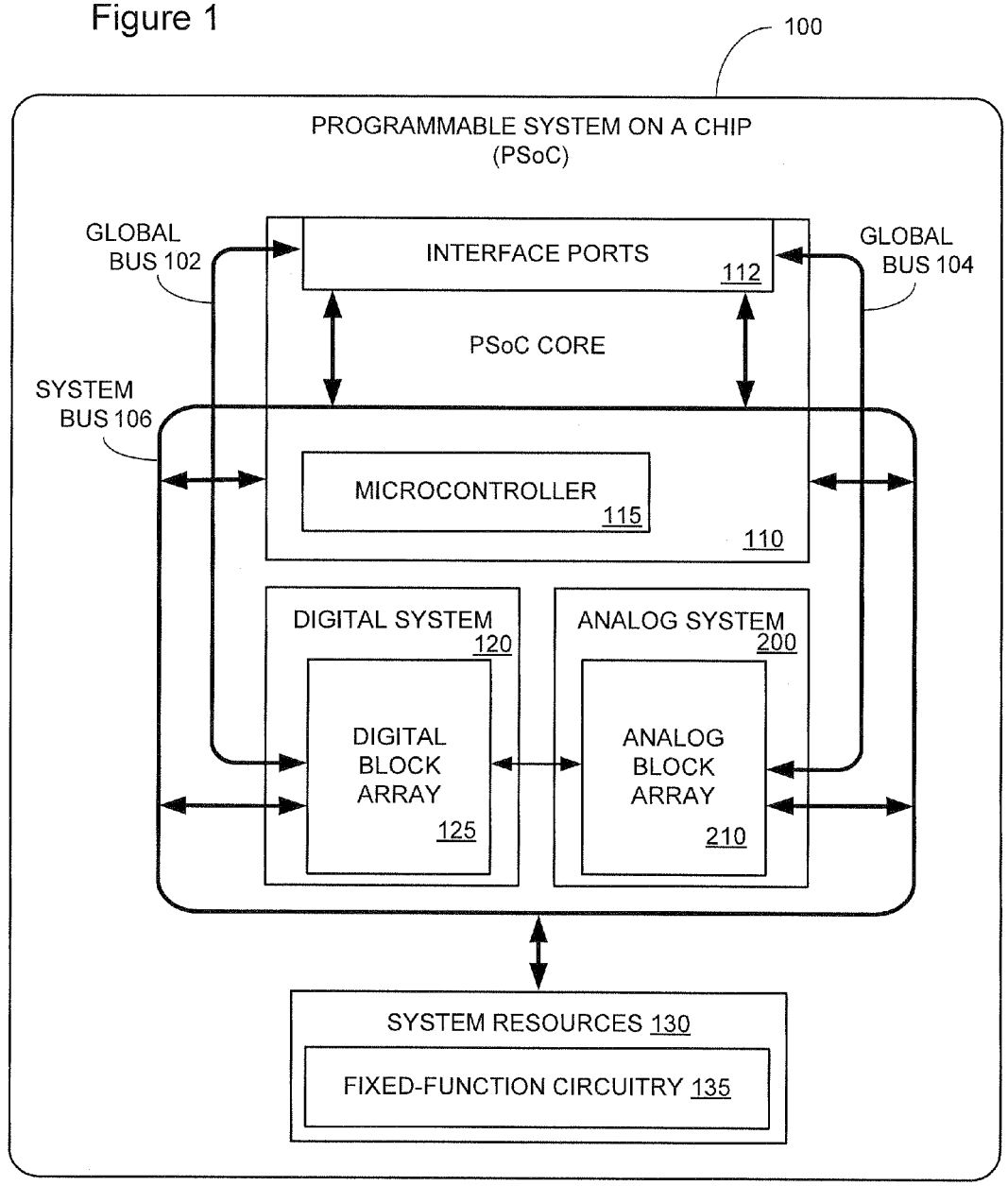
FIG. 1 is a block diagram of an example programmable system on a chip (PSoC) according to embodiments of the invention.

FIG. 1 is a block diagram of an example programmable system on a chip (PSoC) 100 according to embodiments of the invention. Referring to FIG. 1, the programmable system on a chip 100 includes a PSoC core 110 having a microcontroller 115 and interface ports 112. The microcontroller 115 can control operations performed by other blocks of the PSoC 100, such as a digital system 120, an analog system 200, or other system resources 130 via at least one of the global buses 102 and 104 and/or the system bus 106. The PSoC core 110 can also include other elements, such as an interrupt controller and a Direct Memory Access (DMA) controller (not shown).

The digital system 120 includes a digital block array 125 having a plurality of programmable digital circuits (not shown) that can be utilized individually or be variously combined to implement larger applications. In some embodiments, the digital block array 125 can receive configuration commands or control signals and data from the microcontroller 115. The digital system 120 can configure the programmable digital circuits according to the commands and implement applications, such as a timer, a counter, a pulse width modulator, a universal asynchronous receiver transmitter (UART), a cyclical redundancy checker (CRC) or generator, among others.

The analog system 200 includes an analog block array 210 having a plurality of reconfigurable analog circuits (not shown) that can be utilized individually or be variously combined to implement larger applications. In some embodiments, the analog block array 210 can receive configuration commands and data from the microcontroller 115. The analog system 200 can configure the reconfigurable analog circuits according to the commands or control signals and implement continuous-time applications and/or discrete-time applications, such as analog-to-digital converters (ADC), digital-to-analog converters (DAC), trans-impendence amplifiers, mixers, integrators, variable-pole band-pass, low-pass, and notch filters, selectable gain amplifiers, among others. These and other applications can be used to process data signals and/or packets received over the interface ports 112. Embodiments of the analog system 200 and the reconfigurable analog circuits will be described below in greater detail.

The system resources 130 can include fixed-function circuitry 135, which can be utilized alone or in combination with the digital and analog systems 120 and 200 to implement various applications that can be used to process data signals. The fixed-function circuitry 135 can be any digital or analog functional element that is preconfigured in PSoC 100, for example, digital clocks, digital clock dividers, multiply-accumulation circuits, decimators, internal voltage references, integrated switch mode pumps (SMP), among others.

Figure 2:
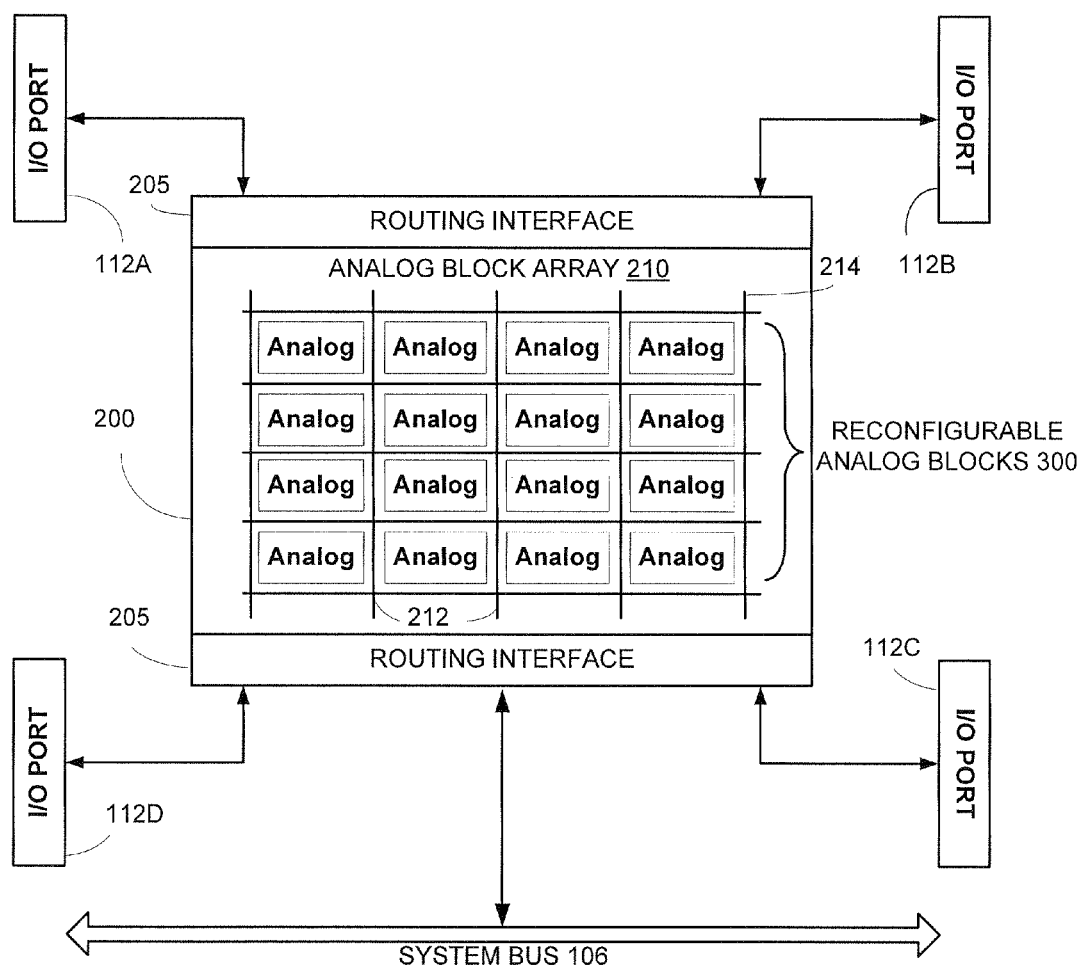
FIG. 2 is a block diagram example of an analog block array that includes a reconfigurable analog device according to embodiments of the invention.

FIG. 2 is a block diagram example of an analog system 200 that includes an array including multiple reconfigurable analog blocks 300 according to embodiments of the invention. Referring to FIG. 2, the analog system 200 includes the analog block array 210 having multiple reconfigurable analog blocks 300 that each can be (re)configured by the microcontroller 115 to implement discrete-time functions or continuous-time functions. As will be described below in greater detail, the reconfigurable analog blocks 300 each incorporate analog circuitry that is reconfigurable to implement various analog devices, which can perform continuous-time functions or discrete-time functions. Embodiments of the reconfigurable analog blocks 300 will be described below in greater detail.

The analog system 200 includes routing interfaces 205 to connect the PSoC core 110, the digital system 120, and other fixed function circuitry 135 to the analog block array 210 using a bus and/or I/O ports, such as system bus 106 and interface ports 112A-112D. The analog block array 210 can include a programmable interconnect matrix 212 and 214 that connects together different reconfigurable analog blocks 300. The routing interfaces 205 can be an extension of the interconnect matrix 212 and 214, for example, at the top and bottom of the analog block array 210.

The interconnect matrix 212 and 214 and the routing interfaces 205 can combine to provide data, voltages, configuration signaling, etc, to the reconfigurable analog blocks 300 from various on-chip devices and possibly from external resources via I/O ports 112A-112D. The interconnect matrix 212 and 214 can also allow the reconfigurable analog blocks 300 to send output data or control/status information to other on-chip devices or external devices via I/O ports 112A-112D, for example, to the microcontroller 115 or the digital system 120.

Figure 3A:
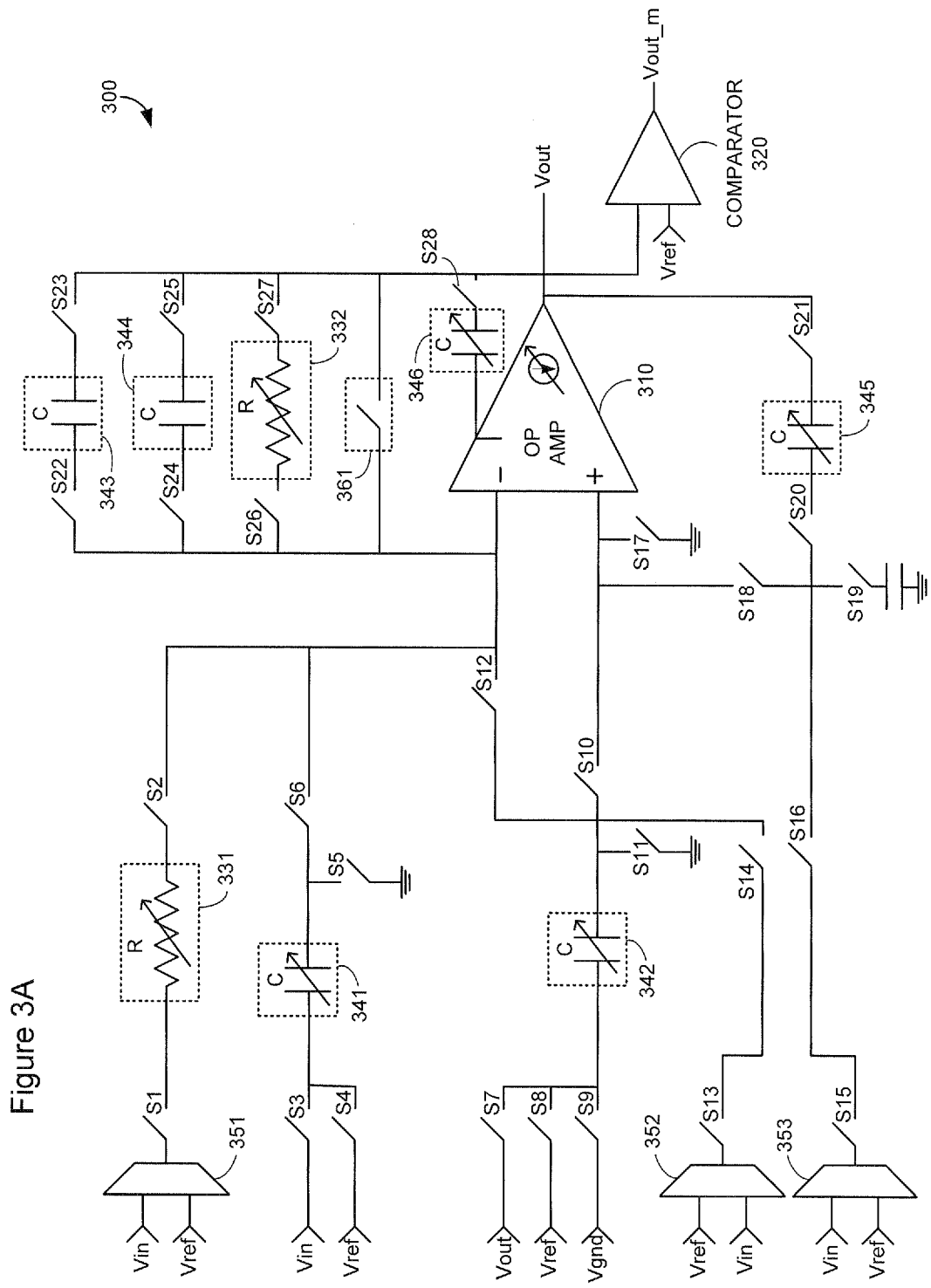
FIG. 3A is a block diagram example of the reconfigurable analog block shown in FIG. 2.

FIG. 3A is a block diagram example of the reconfigurable analog block 300 shown in FIG. 2. Referring to FIG. 3A, the reconfigurable analog block 300 includes an operational amplifier 310 having multiple input terminals—a negative terminal and a positive terminal. The operational amplifier 310 can be configured to generate an output voltage Vout according to the voltages provided to the input terminals and based on a configuration of other analog circuitry in the reconfigurable analog block 300, such as a feedback loop that can include one or more of capacitors 343-344, resistor 332, and switch 361. In some embodiments, the operational amplifier 310 can be a dual-stage folded cascode amplifier with a single-ended class A output, while in other embodiments, the operational amplifier 310 can have various configurations. The operational amplifier 310 can also be a passive element in the reconfigurable analog block 300, e.g., without amplifying an input voltage, and allowing the other analog circuitry in the reconfigurable analog block 300 to generate or determine the output voltage of the reconfigurable analog block 300.

To accommodate varying load conditions, the operational amplifier 310 can include programmable output drive strength functionality and be coupled with a compensation capacitor 346 via switch S28. The programmable output drive strength functionality can be set based on a capacitance of a load coupled to the reconfigurable analog block 300 and/or according a slew rate associated with the operational amplifier 310.

The reconfigurable analog block 300 includes analog circuitry, such as a resistor network (resistors 331-332), a capacitor network (capacitors 341-345), and a comparator 320, that can be selectively coupled to the operational amplifier 310 with a switching network (switches S1-S27 and multiplexers 351-353) and implement various analog functions. The reconfigurable analog block 300 can receive configuration commands or control signals from the microcontroller 115, and can set the resistor network (resistors 331-332), the capacitor network (capacitors 341-345), and the comparator 320, and can be selectively couple them to the operational amplifier 310 with the switching network (switches S1-S27 and multiplexers 351-353) based on the configuration commands or control signals.

The resistor network can include variable resistors that can have their resistance altered depending on the configuration of the reconfigurable analog block 300 and a mode of operation in that particular configuration. The capacitor network can include variable capacitors that can have their capacitance altered depending on the configuration of the reconfigurable analog block 300 and the mode of operation in that particular configuration. The switching network can be controlled, i.e., the switches S1-S27 can be opened and closed, and the multiplexers 351-353 can select voltages to output, responsive to the microcontroller 115, the digital system 120, other elements in the analog system 200, or any combinations thereof.

The switching network can be utilized to electrically couple various resistors from the resistor network and/or various capacitors from the capacitor network to the operational amplifier 310. In some embodiments, the resistors 331-332 can be variable resistors that are tunable, for example, by the microcontroller 115, based on the particular continuous-time function the reconfigurable analog block 300 is to perform. Similarly, the capacitors 341-345 can be variable capacitors that are tunable, for example, by the microcontroller 115, based on the particular discrete-time function the reconfigurable analog block 300 is to perform.

The switching network can selectively couple various voltages, such as an input voltage Vin, a reference voltage Vref, an output voltage Vout, and a ground voltage Vgnd, to the terminals of the operational amplifier 310 or to components of the resistor network or capacitor network. The analog circuitry can be arranged to allow the switching network S1-S27 to selectively connect the resistors 331-332, capacitors 341-345, and comparator 320 with the operational amplifier 310, and to select which of the voltages (Vin, Vref, Vout, or Vgnd) are to be provided to the operational amplifier 310, and the connected resistors 331-332 or capacitors 341-345.

In some embodiments, the reconfigurable analog block 300 can be configured to perform continuous-time functions when the switching network S1-S27 disconnects the capacitors 341-345 from the operational amplifier 310 and connects one or more of the resistors 331-332 to the operational amplifier 310. The continuous-time functions can include a naked operational amplifier or unity gain buffer, a trans-impendence amplifier, a continuous-time mixer, a programmable gain operational amplifier, and other continuous-time circuits.

The reconfigurable analog block 300 can be configured to perform discrete-time functions when the switching network S1-S27 connects one or more of the capacitors 341-345 to the operational amplifier 310 and disconnects the resistors 331-332 from the operational amplifier 310. In some embodiments, the discrete-time functions can include a discrete-time mixer, a track and hold amplifier, an integrator or incrementor, and other discrete-time circuits. Embodiments showing various example configurations of the reconfigurable analog block 300 will be described below in greater detail.

Figure 3B:
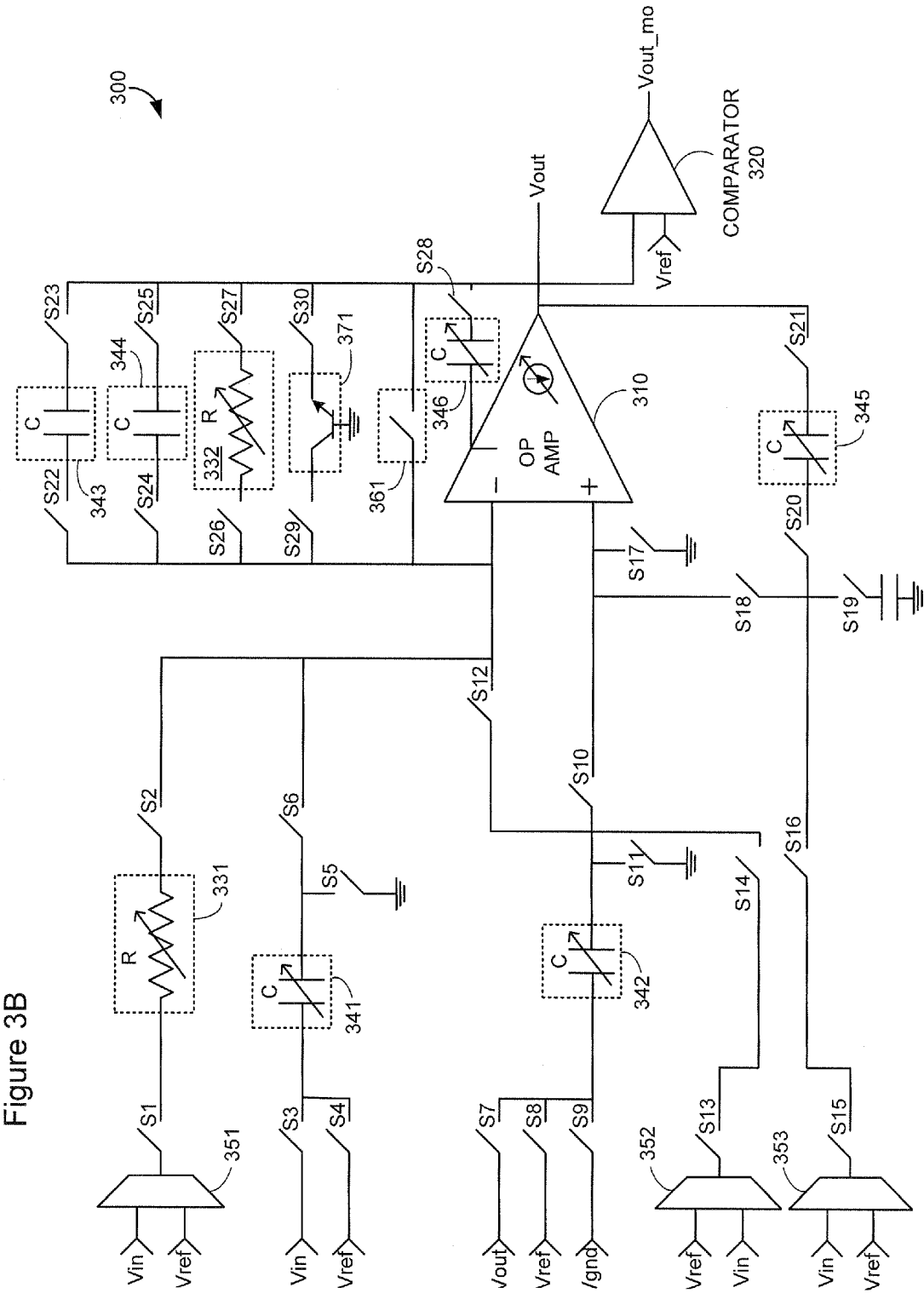
FIG. 3B is another block diagram example of the reconfigurable analog block shown in FIG. 2.

FIG. 3B is another block diagram example of the reconfigurable analog block 300 shown in FIG. 2. Referring to FIG. 3B, the reconfigurable analog block 300 is similar to the reconfigurable analog block described above in FIG. 3A with the following differences. The reconfigurable analog block 300 includes a diode network, shown in FIG. 3B as a non-linear device 371 in a feedback loop between the output and the negative terminal of the operational amplifier 310, which allows the reconfigurable analog block 300 to be configured to perform various non-linear functions. The reconfigurable analog block 300 can include switches S29-S30 coupled to the non-linear device 371, which can selectively connect the non-linear device 371 in the feedback loop of the operational amplifier 310.

In some embodiments, the non-linear device 371 can be a bipolar junction transistor (BJT) with its collector, emitter, and base coupled to the negative terminal, the output of the operational amplifier 310, and ground, respectively. Although FIG. 3B shows the bipolar junction transistor as an NPN-type transistor, in some embodiments, the bipolar junction transistor can be a PNP-type transistor or arranged in other various configurations. Embodiments of the reconfigurable analog block 300 with the non-linear device connected in the feedback loop with be described below in greater detail.

Figure 4C:
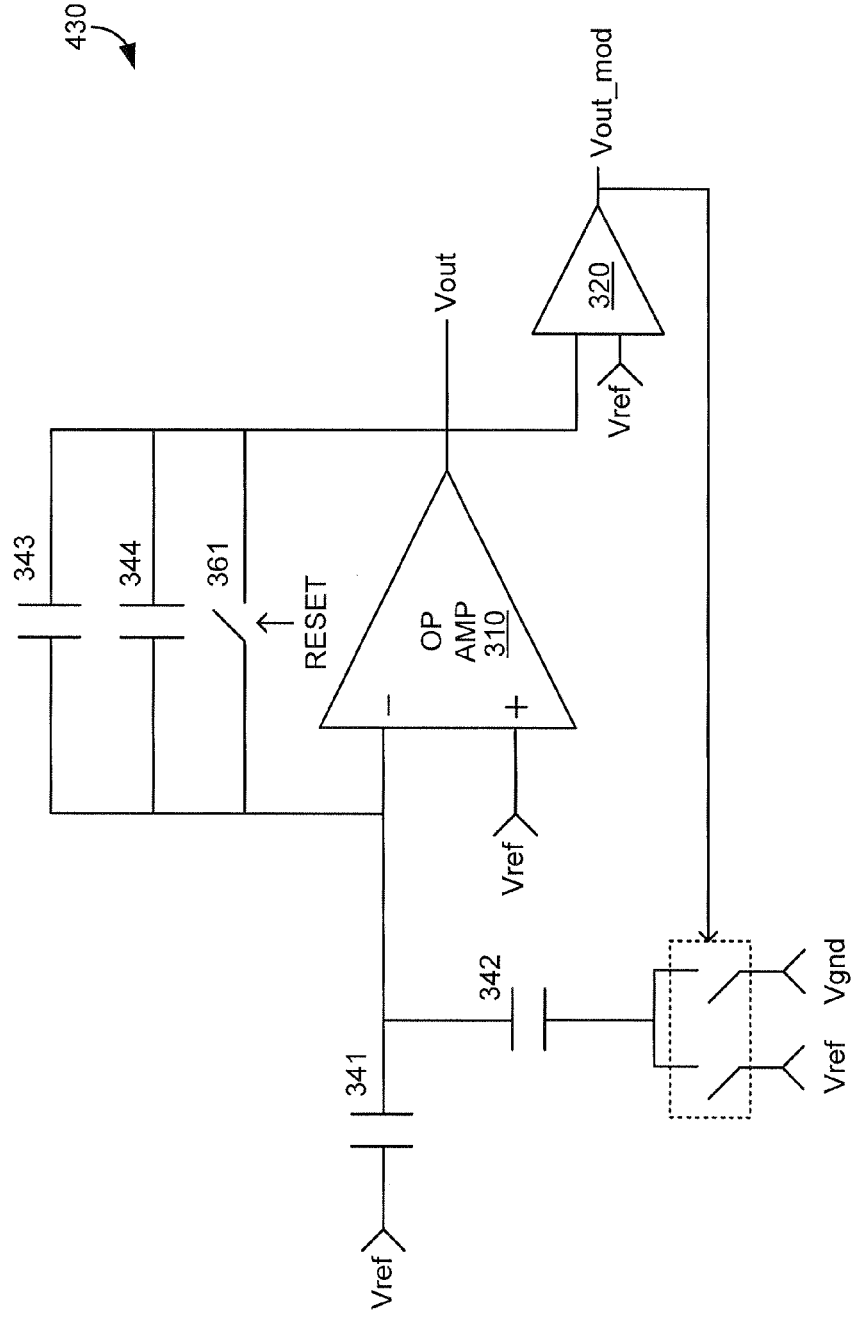

FIGS. 4A-4E are block diagram examples of various continuous-time and discrete-time configurations for the reconfigurable analog block 300 shown in FIGS. 3A-3B. Referring to FIG. 4A, the reconfigurable analog block 300 can be configured by the switching network to implement a continuous-time trans-impedance amplifier 410. The continuous-time trans-impedance amplifier 410 includes the operational amplifier 310 having one resistor connected to its negative terminal and another resistor connected to the feedback loop of the operational amplifier 310. In this embodiment of the continuous-time trans-impendence amplifier 410, the operational amplifier 310 receives a reference voltage Vref at its positive terminal, and the resistor connected to the negative terminal of the operational amplifier 310 can receive an input voltage Vin.

The reconfigurable analog block 300 can be configured to implement the continuous-time trans-impedance amplifier 410 by selectively opening and closing various switches in the switching network to select particular voltages for the operational amplifier 310. In some embodiments, the switching network of the reconfigurable analog block 300 can connect resistor 331 to the negative terminal of the operational amplifier 310. The switching network can also direct an input voltage Vin, for example, from the multiplexer 351, to the resistor 331 and direct a reference voltage Vref, for example, from the multiplexer 353 to the positive terminal of the operational amplifier 310. Referring back to FIGS. 3A and 3B, the switching network can connect resistor 332 in a feedback loop of the operational amplifier 310, e.g., the resistor 332 is connected between the output of the operational amplifier 310 and the negative terminal of the operational amplifier 310.

Since fabrication of the resistor 332 and operating conditions, such as temperature, can cause the resistance value of the resistor 332 to vary, in some embodiments, the continuous-time trans-impedance amplifier 410 can have at least one capacitor connected in parallel with resistor 332 in the feedback loop. The addition of the capacitor can aid in providing stability to output of the continuous-time trans-impedance amplifier 410 during operation.

Referring to FIG. 4B, the reconfigurable analog block 300 can be configured by the switching network to implement a continuous-time mixer 420. The continuous-time mixer 420 is configured to switch between a non-inverting unity gain buffer configuration and an inverting programmable gain amplifier configuration responsive to one or more control signals, such as a clock signal CLK. In some embodiments, the clock signal CLK can be utilized to switch the output of the continuous-time mixer 420, while other control signals or commands can be utilized to configure the reconfigurable analog block 300 into the continuous-time mixer 420.

The continuous-time mixer 420 can implement the inverting programmable gain amplifier by connecting a resistor 331 to the negative terminal of the operational amplifier 310, connecting another resistor 332 in the feedback loop of the operational amplifier 310, and providing an input voltage Vin to the resistor 331 and a reference voltage Vref to the positive terminal of the operational amplifier 310. The continuous-time mixer 420 can implement the non-inverting unity gain buffer by closing a switch 361 in the feedback loop and providing an input voltage Vin the positive terminal of the operational amplifier 310.

The continuous-time mixer 420 includes a switch S1 and a multiplexer 353 that can be used in conjunction with switch 361 to alternate between a configuration that implements the inverting programmable gain amplifier and a configuration that implements the non-inverting unity gain buffer. For instance, when implementing the inverting programmable gain amplifier, the continuous-time mixer 420 can close switch S1, open switch 361, and the multiplexer 353 can select the reference voltage Vref to provide to the positive terminal of the operational amplifier 310. When implementing the non-inverting unity gain buffer, the continuous-time mixer 420 can open switch 51, close switch 361, and the multiplexer 353 can select the input voltage Vin to provide to the positive terminal of the operational amplifier 310. The continuous-time mixer 420 can control of the switches S1 and 361 and the multiplexer 353 through one or more control signals, such as the clock signal CLK.

Referring to FIG. 4C, the reconfigurable analog block 300 can be configured by the switching network to implement a discrete-time integrator 430. In some embodiments, the discrete-time integrator 430 is a portion of a first order modulator having a sampling phase and an integrating phase implemented by the discrete-time integrator 430.

In some embodiments, the discrete-time integrator 430 includes multiple capacitors 343 and 344 coupled in parallel in a feedback loop of the operational amplifier 310. The positive terminal of the operational amplifier 310 is configured to receive a reference voltage Vref and the negative terminal of the operational amplifier 310 is coupled to capacitors 341 and 342. The output of the operational amplifier 310 is provided to a comparator 320, which is configured to compare an output voltage Vout with a reference voltage Vref and generate a modulated output voltage Vout_mod responsive to the comparison. The discrete-time integrator 430 is configured to provide either a reference voltage Vref or a ground voltage Vgnd to the capacitor 342 based on the modulated output voltage Vout_mod from the comparator 320.

The discrete-time integrator 430 includes a switch 361, located in the feedback loop of the operational amplifier 310, which can be opened during integration and closed to reset the discrete-time integrator 430. In some embodiments, the switch 361 can be opened and closed responsive to a reset signal, for example, issued by the microcontroller 115 or other block in the PSoC system.

Figure 4D:
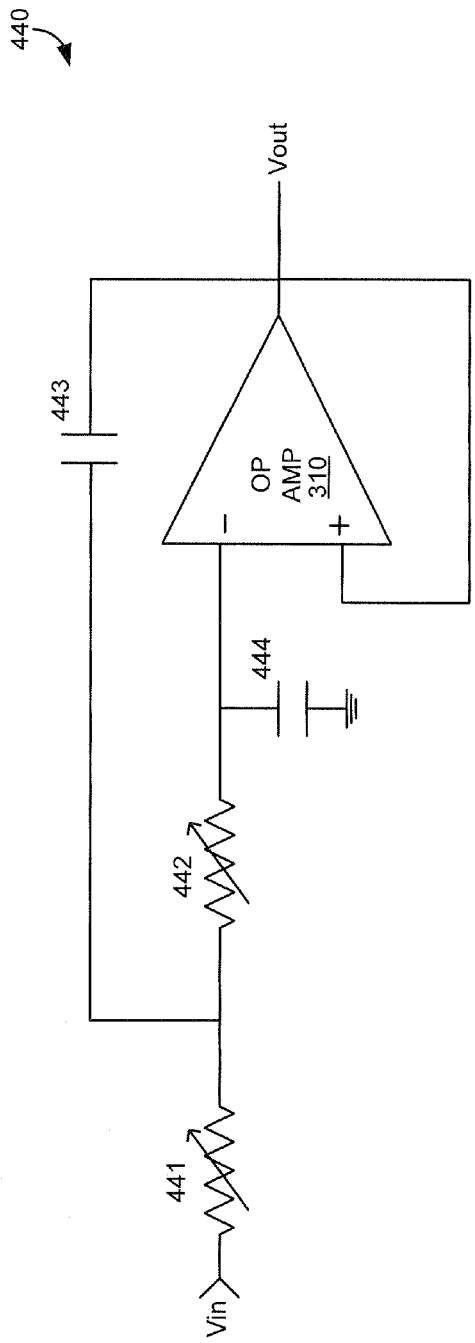

Referring to FIG. 4D, the reconfigurable analog block 300 can be configured by the switching network to implement a continuous-time filter 440, such as an RC (resistor-capacitor) Sallen-Key Filter. Since the reconfigurable analog block 300 includes both a resistor network and a capacitor network, the reconfigurable analog block 300 can be (re)configured to implement resistor-capacitor filters.

The continuous-time filter 440 includes multiple resistors 441 and 442 coupled in series, with resistor 442 connected to the negative terminal of the operational amplifier 310. The resistor 331 can receive an input voltage Vin. The continuous-time filter 440 includes a capacitor 443 coupled between the output of the operational amplifier 310 and between the resistors 441 and 442. The continuous-time filter 440 includes a capacitor 444 coupled to the between the negative terminal of the operational amplifier 310 and a ground.

Figure 4E:
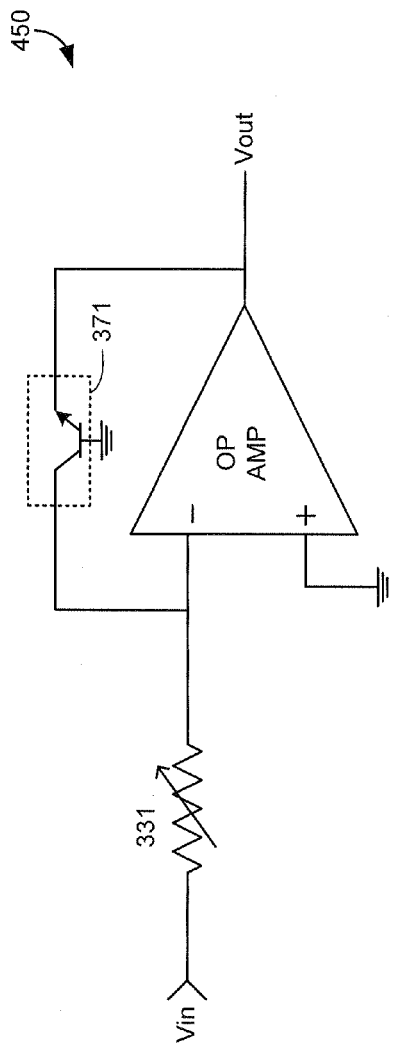

Referring to FIG. 4E, the reconfigurable analog block 300 can be configured by the switching network to implement a logarithmic amplifier 450. The logarithmic amplifier 450 can include a non-linear device 371, such as a BJT, coupled in the feedback loop of the operational amplifier 310. This inclusion of the non-linear device 371 in the feedback loop of the operational amplifier 310 allows the logarithmic amplifier 450 to perform non-linear functions with the operational amplifier 310. The logarithmic amplifier 450 can include a resistor 331 coupled to the negative terminal of the operational amplifier 310 and that can receive an input voltage. The positive terminal of the operational amplifier 310 can receive a ground voltage Vgnd in this implementation.

As described above, FIGS. 4A-4E show various example configurations for the reconfigurable analog block 300 shown in FIGS. 3A-3B. These example configurations show how the reconfigurable analog block 300 can be reconfigured to implement continuous-time circuits, discrete-time circuits, circuits that include both resistors and capacitors, and non-linear circuits. The example configurations shown in FIGS. 4A-4E are not meant to be exhaustive, but merely illustrations of how the reconfigurable analog block 300 can be reconfigured to perform various continuous-time and discrete-time functions.

Figure 5:
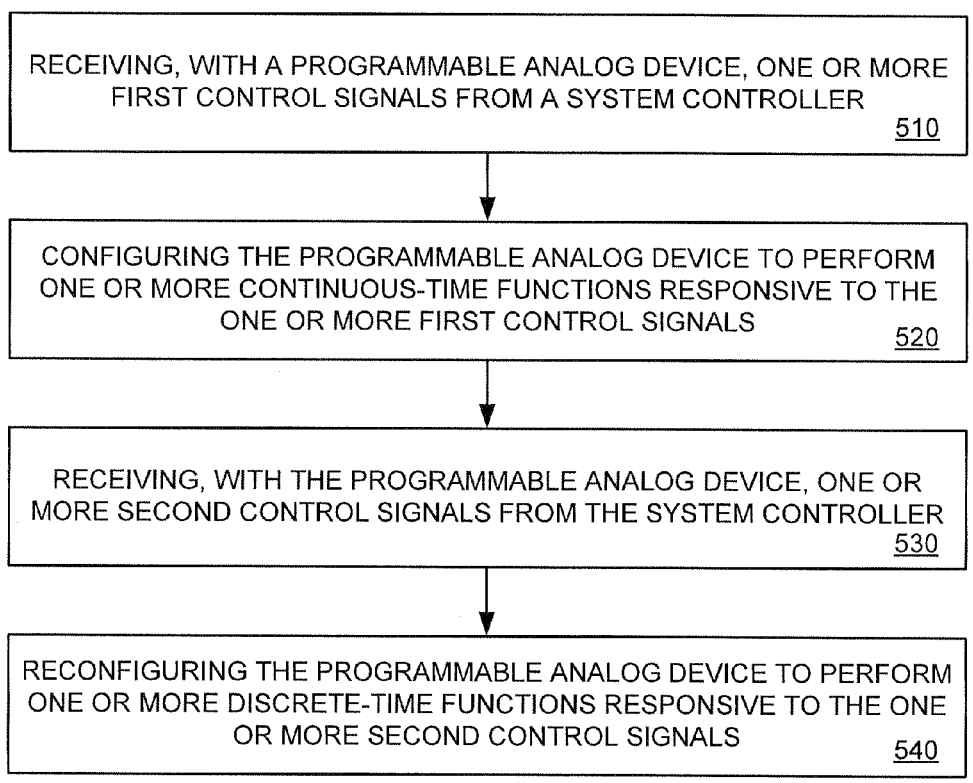
FIG. 5 is an example operational flowchart of the programmable system on a chip according to embodiments of the invention.

FIG. 5 is an example operational flowchart of the programmable system on a chip according to embodiments of the invention. Referring to FIG. 5, in a block 510, a programmable analog device, such as the reconfigurable analog block 300, can be configured to receive one or more first control signals from a system controller, such as the microcontroller 115. In a block 520, the programmable analog device can be configured to perform one or more continuous-time functions responsive to the one or more first control signals. The reconfigurable analog block 300 can configure its switching network to disconnect capacitive elements and connect particular resistive elements to its operational amplifier, allowing the reconfigurable analog block 300 to be configured into a continuous-time circuit capable of providing a continuous-time output voltage. The first control signals can also control which voltages are provided to the connected resistive elements and which voltages are provided to the input terminals of the operational amplifier.

In a block 530, the programmable analog device can be configured to receive one or more second control signals from the system controller. In a block 540, the programmable analog device can be reconfigured to perform one or more discrete-time functions responsive to the one or more second control signals. The reconfigurable analog block 300 can reconfigure its switching network to disconnect resistive elements and connect particular capacitive elements to its operational amplifier, allowing the reconfigurable analog block 300 to be configured into a discrete-time circuit capable of providing a discrete-time output voltage. The second control signals can also direct certain switches to periodically open and close and direct certain multiplexers to alternate which voltages they output based on the second control signals.

In some embodiments, the reconfigurable analog block 300 can receive control signals that direct the switching network to connect both resistive elements and capacitive elements to the operational amplifier, for example, as shown in FIG. 4D. The reconfigurable analog block 300 can also receive control signals that direct the switching network to connect at least one non-linear element from a diode network to the operational amplifier, for example, as shown in FIGS. 3B and 4E.

One of skill in the art will recognize that the concepts taught herein can be tailored to a particular application in many other ways. In particular, those skilled in the art will recognize that the illustrated embodiments are but one of many alternative implementations that will become apparent upon reading this disclosure.

The preceding embodiments are examples. Although the specification may refer to "an", "one", "another", or "some" embodiment(s) in several locations, this does not necessarily mean that each such reference is to the same embodiment(s), or that the feature only applies to a single embodiment.

The invention claimed is:

1. A programmable device comprising:
    an operational amplifier to generate an output voltage based on input voltages at input terminals thereof; and
    circuitry to provide the input voltages to the operational amplifier, wherein the configuration of the circuitry allows the programmable device to implement discrete-time or continuous-time functions, wherein the circuitry comprises a resistor network and a capacitor network configured to be selectively coupled to the operational amplifier.

2. The programmable device of claim 1, wherein the resistor network is configurable to provide the input voltages to the input terminals of the operational amplifier, and the capacitor network is configurable to provide the input voltages to the input terminals of the operational amplifier.

3. The programmable device of claim 2, wherein the capacitor network includes one or more capacitors that, when configured to provide at least one input voltage to one or more of the input terminals, cause the operational amplifier to generate a discrete-time output voltage.

4. The programmable device of claim 2, wherein the resistor network includes one or more resistors that, when configured to provide at least one in put voltage to one or more of the input terminals, cause the operational amplifier to generate a continuous-time output voltage.

5. The programmable device of claim 2, wherein the circuitry is reconfigurable to provide the input voltages to the input terminals of the operation amplifier utilizing both the resistor network and the capacitor network.

6. The programmable device of claim 2, wherein the circuitry includes a switching system to reconfigure the capacitor network and the resistor network, wherein the switching system is configured to control which elements in the capacitor network and the resistor network are coupled one or more of the input terminals of the operational amplifier.

7. The programmable device of claim 1, wherein the operational amplifier comprises a plurality of configurable analog blocks.

8. A device comprising:
   an operational amplifier to generate an output voltage based on input voltages received at input terminals thereof; and
   circuitry including:
      a resistor network configurable to provide the input voltages to the input terminals of the operational amplifier to implement one or more continuous-time functions; and
      a capacitor network configurable to provide the input voltages to the input terminals of the operational amplifier to implement one or more discrete-time functions,
      wherein the resistor network and the capacitor network are configured to be selectively coupled to the operational amplifier.

9. The device of claim 8, wherein the capacitor network includes one or more capacitors that, when configured to provide at least one input voltage to one or more of the input terminals, cause the operational amplifier to generate a discrete-time output voltage.

10. The device of claim 8, wherein the resistor network includes one or more resistors that, when configured to provide at least one input voltage to one or more of the input terminals, cause the operational amplifier to generate a continuous-time output voltage.

11. The device of claim 8, wherein the circuitry includes a switching system to configure the capacitor network and the resistor network, wherein the switching system is configured to control which elements in the capacitor network and the resistor network are coupled one or more of the input terminals of the operational amplifier.

12. The device of claim 8, wherein the circuitry is reconfigurable to provide the input voltages to the input terminals of the operational amplifier from the resistor network and the capacitor network.

13. The device of claim 8, wherein the circuitry includes a diode network that, when coupled to at least one of the input terminals, allows the device to perform non-linear functions with the operational amplifier.

14. The device of claim 8, wherein the operational amplifier comprises a plurality of configurable analog blocks.

15. A method comprising:
   receiving, with a programmable device, one or more first control signals, wherein the programmable device comprises an operational amplifier, a resistor network, and a capacitor network;
   configuring the programmable device to perform one or more continuous-time functions responsive to the one or more first control signals, wherein the configuring comprises connecting the resistor network to the operational amplifier;
   receiving, with the programmable device, one or more second control signals; and
   reconfiguring the programmable device to perform one or more discrete-time functions responsive to the one or more second control signals, wherein the reconfiguring comprises connecting the capacitor network.

16. The method of claim 15, wherein the operational amplifier is configured to generate an output based on voltages at input terminals thereof, and the circuitry is configured to provide the voltages to the operational amplifier.

17. The method of claim 16, wherein the configuring of the programmable device to perform one or more continuous-time functions includes reconfiguring the circuitry to provide the voltages to the input terminals of the operational amplifier through the resistor network responsive to the one or more first control signals.

18. The method of claim 17, wherein a resistor network includes one or more resistors that, when configured to provide at least one input voltage to one or more of the input terminals, cause the operational amplifier to generate a continuous-time output voltage.

19. The method of claim 16, wherein the reconfiguring of the programmable device to perform one or more discrete-time functions includes reconfiguring the circuitry to provide the voltages to the input terminals of the operational amplifier through the capacitor network responsive to the one more second control signals.

20. The method of claim 19, wherein the capacitor network includes one or more capacitors that, when configured to provide at least one in put voltage to one or more of the input terminals, cause the operational amplifier to generate a discrete-time output voltage.

* * * * *